United States Patent [19]

Liepe

[11] Patent Number: 5,519,581
[45] Date of Patent: May 21, 1996

[54] MOUNTING OF TOROIDAL INDUCTORS

[75] Inventor: Steven F. Liepe, Fort Collins, Colo.

[73] Assignee: Hewlett-Packard Company, Palo Alto, Calif.

[21] Appl. No.: 327,072

[22] Filed: Oct. 21, 1994

[51] Int. Cl.⁶ ........................................... H05K 7/02
[52] U.S. Cl. .................. 361/782; 333/172; 333/177; 336/174; 336/175; 361/811; 361/821
[58] Field of Search ......................... 333/172, 177, 333/181–183; 336/174, 175, 229; 361/766, 782, 811, 821

[56] References Cited

U.S. PATENT DOCUMENTS 2,464,376  3/1949  Cohen et al. .................... 361/766
3,538,441  11/1970 Tanaka .................................. 336/175
5,374,907  12/1994 Orita et al. ............................. 336/175

*Primary Examiner*—Donald A. Sparks
*Attorney, Agent, or Firm*—Edward L. Miller

[57]            ABSTRACT

A small toroidal inductor is mounted by inserting a high valued resistor or a ceramic coil form into the central hole of the toroid. The fine leads of the inductor are then soldered to the much stiffer leads of the part that has been inserted. These stiffer leads may be bent in any desired way, and will hold their shape. This makes insertion easier and is strong enough to withstand the necessary amounts of shock and vibration. The toroid may be glued or otherwise affixed with an adhesive to the resistor or coil form.

12 Claims, 1 Drawing Sheet

5,519,581

MOUNTING OF TOROIDAL INDUCTORS

BACKGROUND OF THE INVENTION

High volume low cost products are extremely sensitive to the cost of parts and the ease with which their constituent assemblies can be fabricated. Small toroidal inductors can be difficult to mount on printed circuit boards, owing to the toroidal shape and small wire size (too weak to hold the part in place during shock or vibration). Furthermore, fine wire gauges are often difficult to insert into the mounting holes of a printed circuit board.

Conventional solutions to the problems of mounting small toroidal inductors include gluing the toroid to the printed circuit board and affixing the toroid to a plastic carrier, or "boat", that has stiff leads of its own. Also included are various forms of staking the toroid to the board. These conventional solutions raise the cost of assemblies that use small toroidal inductors.

SUMMARY OF THE INVENTION

A solution to the problem of reducing the cost of mounting a small toroidal inductor is to insert a high valued resistor or a coil form of ceramic or phenolic into the central hole of the toroid. The fine leads of the inductor are then soldered to the much stiffer leads of the part that has been inserted. These stiffer leads may be bent in any desired way, and will hold their shape. This makes insertion easier and the resulting part is strong enough to withstand the necessary amounts of shock and vibration. The toroid may be glued or otherwise affixed with an adhesive to the resistor or coil form, although in some cases this may not be necessary.

The cost of this solution is actually less than mounting the toroid with its own winding leads, as the minimal cost of the resistor or coil form is more than compensated for by the improved ease of inserting the new part.

DESCRIPTION OF A PREFERRED EMBODIMENT

Figure 1:
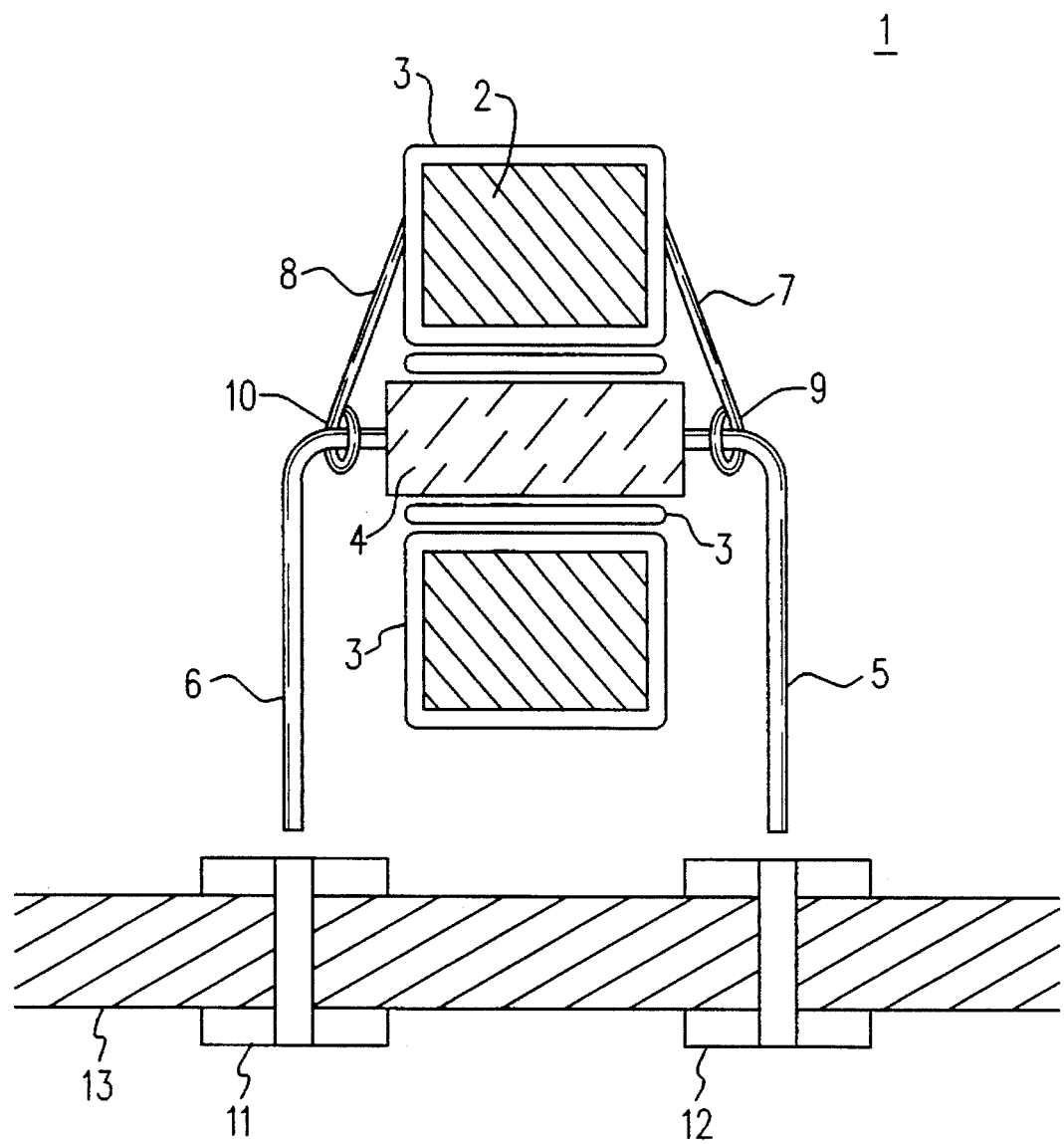
FIG. 1 is a cross sectional view of a small toroidal inductor adapted for mounting by utilizing the leads of a resistor or a coil form.

Refer now to FIG. 1, wherein is shown a cross sectional view of a small toroidal inductor 1 adapted for mounting in accordance with the invention. In particular, a toroid 2 of magnetically permeable material has wound over its surface windings 3 whose ends 7 and 8 are the electrical leads of an inductor. A resistor or coil form 4 is inserted through the hole in the toroid 2. The resistor or coil form 4 may have either radial or axial leads, as is most convenient; the illustration in FIG. 1 depicts axial leads. The leads 5 and 6 of the resistor 4 are shaped to accommodate mounting into the overall circuit, which in this case is onto a printed circuit board 13 having plated through holes 11 and 12. The leads 7 and 8 of the inductor are mechanically and electrically attached to the resistor leads 5 and 6 at locations 9 and 10 that are close to where the leads 5 and 6 meet the body of the resistor or coil form. Soldering is the preferred method of mechanical and electrical attachment, although other methods are possible; e.g., spot welding.

The resistance of the resistor 4 is selected to be sufficiently high so as to be safely ignored as far its effect upon the circuit is concerned. For related reasons, it may be desirable to avoid using wire wound resistors in favor of carbon composition or metal film resistors, in order to minimize the possibility of parasitic reactances. Wattage and tolerance are not directly of interest in themselves, except as the wattage affects the size of the resistor in relation to the opening in the toroid; a snug fit is desirable. Also, the larger the resistor or coil form, the thicker are its leads 5 and 6, which enhances the strength and rigidity desired in the overall part 1. If desired, the resistor or coil form 4 may be cemented or glued into the hole of the toroid 2, although in some instances this may not be necessary, particularly where the fit is very snug and the leads of the inductor are of a large gauge to begin with. It may also be desirable to either slip short lengths of insulating tubing over the leads 5 and 6, or apply short lengths of heat shrink tubing thereto. The latter makes an especially nice way to insulate the solder joints 9 and 10 from adjacent components on a printed circuit board.

A specific example may be useful in appreciating the invention. In one instance a 72 µH inductor is fabricated for use as a 250 mA filter reactor in a switching power supply operating at 100 KHz. The inductor itself is forty turns of 27 AWG enameled wire upon a T38-26 toroid core from Micro Metals. Into the hole in the toroid is inserted an Abracon CC-24 ceramic coil form, or bobbin, that is 2 mm in diameter and 4 mm in length, and which has 22 AWG axial leads. The ceramic bobbin is glued in place, and the axial leads of the bobbin are bent at right angles to produce a toroidal inductor with stiff radial leads.

I claim:

1. An inductive component comprising:

an inductor wound upon a toroid of magnetically permeable material, the inductor having first and second leads;

a resistor having a body and first and second leads, the body disposed such that it passes through the hole in the center of the toroid, the resistor having a resistance sufficiently high that it does not materially influence the operation of an electrical circuit in which the inductor is used;

the first lead of the inductor electrically and mechanically connected to the first lead of the resistor at a location proximate where the first lead of the resistor lead meets the resistor body, and the second lead of the inductor electrically and mechanically connected to the second lead of the resistor at a location proximate where the second lead of the resistor meets the resistor body.

2. An inductive component as in claim 1 wherein the body of the resistor is cylindrical.

3. An inductive component as in claim 1 wherein the leads of the inductor are soldered to the leads of the resistor.

4. An inductive component as in claim 1 wherein the inductor is cemented to the body of the resistor.

5. An inductive component as in claim 1 wherein the resistor has axial leads, each of which has a generally right angle bend.

6. An inductive component as in claim 1 wherein the resistor has radial leads.

7. An inductive component comprising:

an inductor wound upon a toroid of magnetically permeable material, the inductor having first and second leads;

a coil form having a body and first and second leads, the body disposed such that it passes through the hole in the center of the toroid;

the first lead of the inductor electrically and mechanically connected to the first lead of the coil form at a location proximate where the first lead of the coil form lead meets the coil form body, and the second lead of the inductor electrically and mechanically connected to the second lead of the coil form at a location proximate where the second lead of the coil form meets the coil form body.

8. An inductive component as in claim 7 wherein the leads of the inductor are soldered to the leads of the resistor.

9. An inductive component as in claim 7 wherein the inductor is cemented to the body of the coil form.

10. An inductive component as in claim 7 wherein the coil form has axial leads, each of which has a generally right angle bend.

11. An inductive component as in claim 7 wherein the coil form has radial leads.

12. A method of attaching mounting leads to the wires of an inductor wound from that wire upon a toroid, the method comprising the steps of:

inserting a resistor having a body and first and second mounting leads into the hole in the center of the toroid until a generally equal amount of the resistor body extends from each side of the toroid;

selecting the resistance of the resistor to be sufficiently large that it can be ignored when the inductor is used in a circuit of interest;

soldering one wire of the inductor to one of the resistor's mounting leads at a location proximate where the mounting lead meets the body of the resistor; and soldering the other wire of the inductor to the other mounting lead of the resistor at a location proximate where that mounting lead meets the body of the resistor.

* * * * *